United States Patent
Lee et al.

(10) Patent No.: US 7,904,048 B2
(45) Date of Patent: Mar. 8, 2011

(54) MULTI-TAP DIRECT SUB-SAMPLING MIXING SYSTEM FOR WIRELESS RECEIVERS

(75) Inventors: Meng-Chang Lee, Allen, TX (US); Khurram Muhammad, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 790 days.

(21) Appl. No.: 11/935,318

(22) Filed: Nov. 5, 2007

(65) Prior Publication Data
US 2009/0002066 A1 Jan. 1, 2009

Related U.S. Application Data

(60) Provisional application No. 60/947,192, filed on Jun. 29, 2007.

(51) Int. Cl.
 *H04B 1/10* (2006.01)
 *H03B 1/00* (2006.01)
(52) U.S. Cl. ............... 455/307; 455/306; 327/554
(58) Field of Classification Search .......... 455/306, 455/307, 189.1, 190.1, 293; 333/173; 327/552–554
See application file for complete search history.

(56) References Cited

U.S. PATENT DOCUMENTS

| | | | | |
|---|---|---|---|---|
| 4,290,034 A * | 9/1981 | Fraser et al. | ........ | 333/173 |
| 4,354,169 A * | 10/1982 | Nossek | ........ | 333/173 |
| 4,543,546 A * | 9/1985 | Hariharan | ........ | 333/173 |
| 6,150,875 A * | 11/2000 | Tsinker | ........ | 327/552 |
| 6,177,897 B1 | 1/2001 | Williams | | |
| 6,509,791 B2 * | 1/2003 | Segawa et al. | ........ | 327/554 |
| 6,556,072 B1 * | 4/2003 | Nicollini et al. | ........ | 327/554 |
| 6,621,441 B2 | 9/2003 | Haroun | | |
| 6,891,429 B1 | 5/2005 | Early | | |
| 7,006,813 B2 | 2/2006 | Staszewski | | |
| 7,057,540 B2 | 6/2006 | Muhammad | | |
| 7,079,826 B2 | 7/2006 | Muhammad | | |
| 7,652,526 B2 * | 1/2010 | Welles et al. | ........ | 327/554 |
| 2007/0105522 A1 | 5/2007 | Muhammad | | |

OTHER PUBLICATIONS

Peterson, Sigurd, PSoC microcontroller and LVDT measure position, Design Ideas, Oct. 26, 2006, 3 pages.
Lacanette, Kerry, A Basic Introduction to Filters-Active, Passive, and Switched-Capacitor, National Semiconductor Application Note 779, Apr. 1991, 22 pages.

* cited by examiner

*Primary Examiner*—Sonny Trinh
(74) *Attorney, Agent, or Firm*—Ronald O. Neerings; Wade James Brady, III; Frederick J. Telecky, Jr.

(57) ABSTRACT

A multi-tap direct sub-sampling mixing system for wireless receivers is provided with a dynamically configurable passive switched capacitor filter. A front end amplifier is connected to receive a signal. The passive switched capacitor filter is connected to receive the amplified signal and has an output for providing a filtered signal. The switched capacitor filter has at least two sections that are each operable as a pole, wherein a first section of the at least two sections has sets of at least two stacked capacitors interconnected with a set of switches operable to amplify in input voltage provided to an input of the first section in response to operation of the set of switches; and a back end section connected to the output of the switched capacitor filter to receive the filtered signal.

16 Claims, 8 Drawing Sheets

MULTI-TAP DIRECT SUB-SAMPLING MIXING SYSTEM FOR WIRELESS RECEIVERS

CROSS-REFERENCE TO RELATED APPLICATIONS

The present application claims priority to and incorporates by reference provisional application U.S. 60/947192 "A Configurable Low-Noise High Linearity Multi-Tap Direct Sub-Sampling Mixing (MTDSM) System For Wireless Receiver" filed on 29 Jun. 2007.

FIELD OF THE INVENTION

This invention generally relates to filters and more specifically to a switched capacitor filter.

BACKGROUND OF THE INVENTION

As signal processing systems move to higher levels of integration, it becomes necessary to integrate analog functions on chips in which most of the area is consumed by digital circuitry. When the analog circuitry occupies only a small percentage of the total chip area, economic considerations limit the addition of any process steps, such as fabrication of high-value capacitors, which are not required by the digital circuits.

The switched capacitor ("SC") filter provided a practical alternative. The original idea was to replace a resistor by a switched capacitor simulating the resistor. Thus the equivalent resistor could be implemented with a capacitor, and two switches operating with two clock phases. The basic building blocks involved in SC circuits are capacitors, MOSFET switches, and op-amps, which can be used to make higher-order blocks such as voltage gain amplifiers, integrators, and second-order filters. These are discrete-time filters that operate like continuous-time filters, but through the use of switches, the capacitance values can be kept very small. As a result, SC filters are amenable to VLSI implementations.

Infinite impulse response (IIR) is a property of signal processing systems. Systems with that property are known as IIR systems or when dealing with electronic filter systems as IIR filters. They have an impulse response function which is non-zero over an infinite length of time. This is in contrast to finite impulse response filters (FIR) which have fixed-duration impulse responses. The simplest analog IIR filter is an RC filter made up of a single resistor (R) feeding into a node shared with a single capacitor (C). This filter has an exponential impulse response characterized by an RC time constant.

The switching functions of the MOSFETs produces a discrete response rather than a continuous response from the filter. Therefore, Z Transforms are employed rather than S Transforms, and, just as in digital filters, aliasing effects occur. Any Z Transform approximation to a continuous function may be used to design a switched capacitor filter.

U.S. Pat. No. 7,079,826, "Digitally controlled analog RF filtering in subsampling communication receiver architecture" describes a method of down-converting a first periodic voltage waveform into a second periodic voltage waveform by sampling the first periodic waveform and transforming the first voltage waveform into a corresponding current waveform, integrating each half-cycle of the current waveform by charging a corresponding capacitor; and combining the samples to produce the second voltage waveform, and is incorporated herein by reference in its entirety.

U.S. Pat. No. 7,006,813, "Efficient charge transfer using a switched capacitor resistor" describes a method for setting a voltage on a sampling capacitor by applying a first substantially constant charging current to a charging capacitor for a first period of time to store a first charge on the charging capacitor, using the charging capacitor to share the first charge with the sampling capacitor, and leaving a residual charge on the charging capacitor; maintaining the residual charge on the charging capacitor after sharing with the sampling capacitor, and applying a second charging current to the charging capacitor for a second period of time to bring the charge on the charging capacitor from the residual charge to a second charge, and is incorporated herein by reference in its entirety.

U.S. Pat. No. 7,057,540, "Sigma-delta (.SIGMA..DELTA.) analog-to-digital converter (ADC) structure incorporating a direct sampling mixer" describes a sampling circuit using switched capacitors with low noise characteristics and at the same time is capable of providing a highly oversampled discrete-time sample stream, and is incorporated herein by reference in its entirety.

US Publication 20070105522, "Offset balancer, method of balancing an offset and a wireless receiver employing the balancer and the method" describes an offset balancer for use with a differential mixer employing wireless reception and an offset quantifier configured to indicate an existing DC offset of the mixer corresponding to an existing second-order intercept point applicable to the wireless reception, and is incorporated herein by reference in its entirety.

SUMMARY OF THE INVENTION

An embodiment of the present invention provides a multi-tap direct sub-sampling mixing system for wireless receivers with a dynamically configurable passive switched capacitor filter. A front end amplifier is connected to receive a signal. The passive switched capacitor filter is connected to receive the amplified signal and has an output for providing a filtered signal. The switched capacitor filter has at least two sections that are each operable as a pole, wherein a first section of the at least two sections has sets of at least two stacked capacitors interconnected with a set of switches operable to amplify in input voltage provided to an input of the first section in response to operation of the set of switches; and a back end section connected to the output of the switched capacitor filter to receive the filtered signal.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
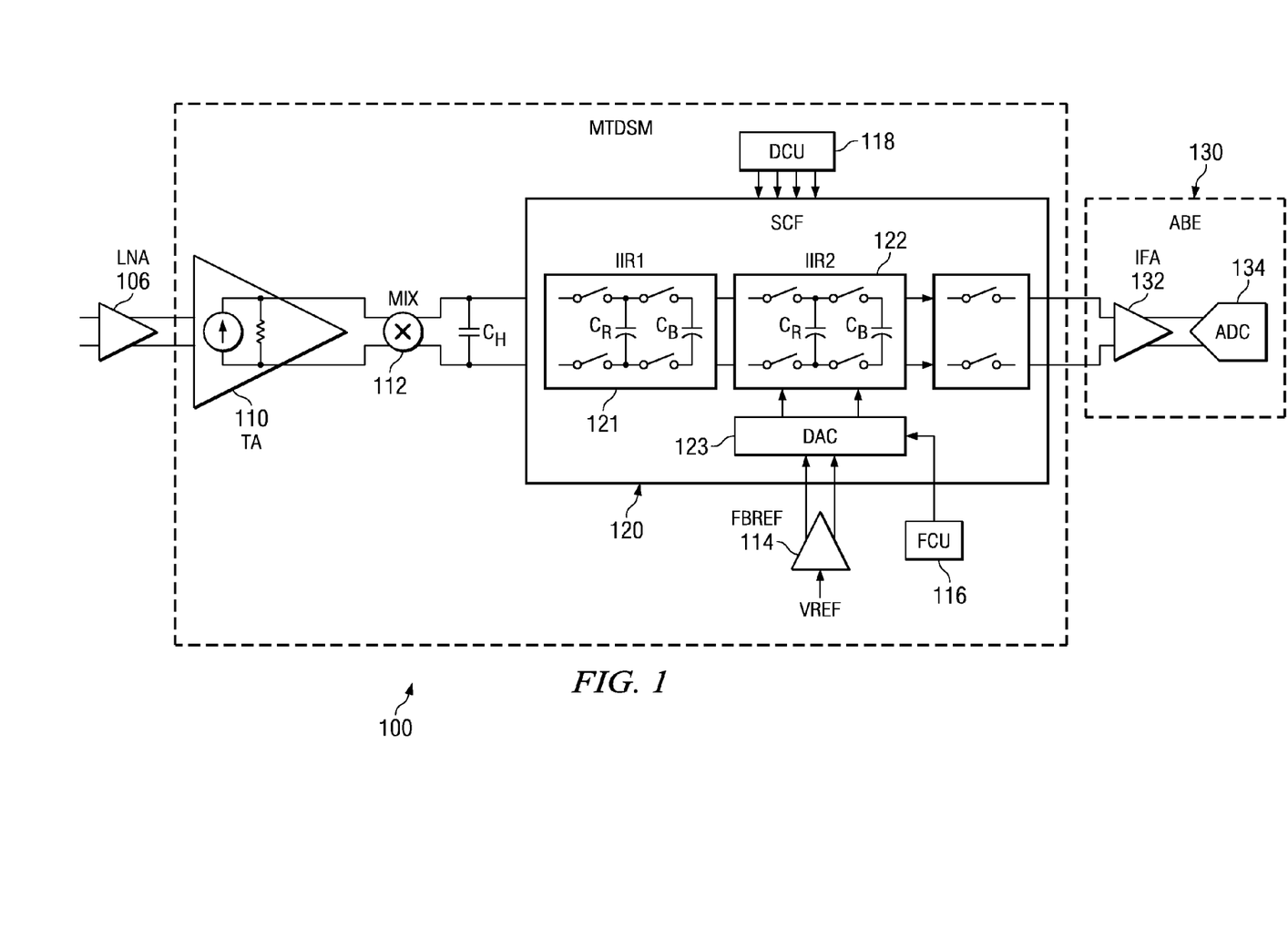
FIG. 1 is a block diagram of a digital system with a passive switched capacitor filter.

FIG. 1 is a block diagram of a digital system 100 with a passive switched capacitor filter 120. Digital system 100 is representative of a variety of different systems that are designed for receiving an analog signal, filtering the signal to select a particular frequency band, and then converting the filtered signal to the digital domain for further processing by a digital signal processor. One example of such a system is a radio receiver. Various types of radio receivers have need for selecting a particular frequency and processing a data or audio signal being transmitted on that frequency. A particular embodiment of digital system 100 is in a cellular telephone handset.

The Global System for Mobile Communications (GSM: originally from Groupe Special Mobile) is currently the most popular standard for mobile phones in the world and is referred to as a 2G (second generation) system. W-CDMA (Wideband Code Division Multiple Access) is a type of 3G (third generation) cellular network. W-CDMA is the higher speed transmission protocol designed as a replacement for the aging 2G GSM networks deployed worldwide. More technically, W-CDMA is a wideband spread-spectrum mobile air interface that utilizes the direct sequence Code Division Multiple Access signaling method (or CDMA) to achieve higher speeds and support more users compared to the older TDMA (Time Division Multiple Access) signaling method of GSM networks.

Digital system 100 includes an analog front end portion and analog backend portion (ABE) 130. The analog front end includes low noise amplifier 106 that receives a radio frequency (RF) signal from an antenna, not shown, and amplifies the low level signal using low noise amplification techniques. The total gain is limited in order to minimize compression of the later stages which results in degradation to signal to noise ratio (SNR) of the signal under blocking condition due to strong interferers. The amplified RF signal is then connected to multi-tap direct sub-sampling mixing (MTDSM) system 102 for further amplification and filtering.

Transconductance amplifier (TA) 110 produces an analog output signal in which the current is proportional to the input voltage signal. The output of TA 110 is provided to mixer 112 that down mixes the RF signal to a lower intermediate frequency. The output of mixer 112 is developed across holding capacitor CH and provided to passive switched capacitor filter (SCF) 120. SCF 120 includes two infinite impulse response (IIR) stages IIR1 121 and IIR2 122.

FeedBack REFerence (FBREF) circuit 114 provides a reference voltage signal to digital to analog converter (DAC) 123 that produces an analog common mode voltage used by IIR2. FBREF 114 is basically a voltage buffer for VREF. VREF is provided from a bandgap reference device which is a reference voltage for the whole analog portion 102. In this embodiment, VREF is approximately 0.9 v. Feedback control unit (FCU) 116 is a sigma-delta modulator that controls DAC 123. Digital control unit (DCU) 118 generates the timing signals used to control the various MOSFET switches within SCF 120. DCU 118 generates a series of non-overlapping timing signals using a shift register circuit.

An output of SCF 120 is provided to ABE 130. ABE 130 includes intermediate frequency amplifier (IFA) 132 that further amplifies the signal produced by SCF 120 that is then connected to analog to digital converter (ADC) 134. ADC 134 samples and converts the continuous time signal to a digital signal that is then provided to a digital signal processing (DSP) unit, not shown, for further processing.

Due to noise generated by the conversion processes in ABE 130, a sufficient input signal to ABE 130 is needed to maintain certain SNR required by DBB. The analog front end (AFE) circuits must provide sufficient gain while maintaining a good front-end linearity. Passive SCF 120 helps in providing the needed front end gain by producing gain in addition to filtering. This approach is superior to doing the same thing in an active filter since a passive SCF has lower noise and better linearity. This allows the gain level of the LNA and TA to be set at a lower value in order to improve linearity. SCF is also used to cancel the DC offset at the output of ADC 130 which degrades the SNR performance of a receiver. Furthermore, SCF 130 is dynamically configurable in order to better support different wireless standards. This enables support of different standards such as GSM and W-CDMA.

Figure 2:
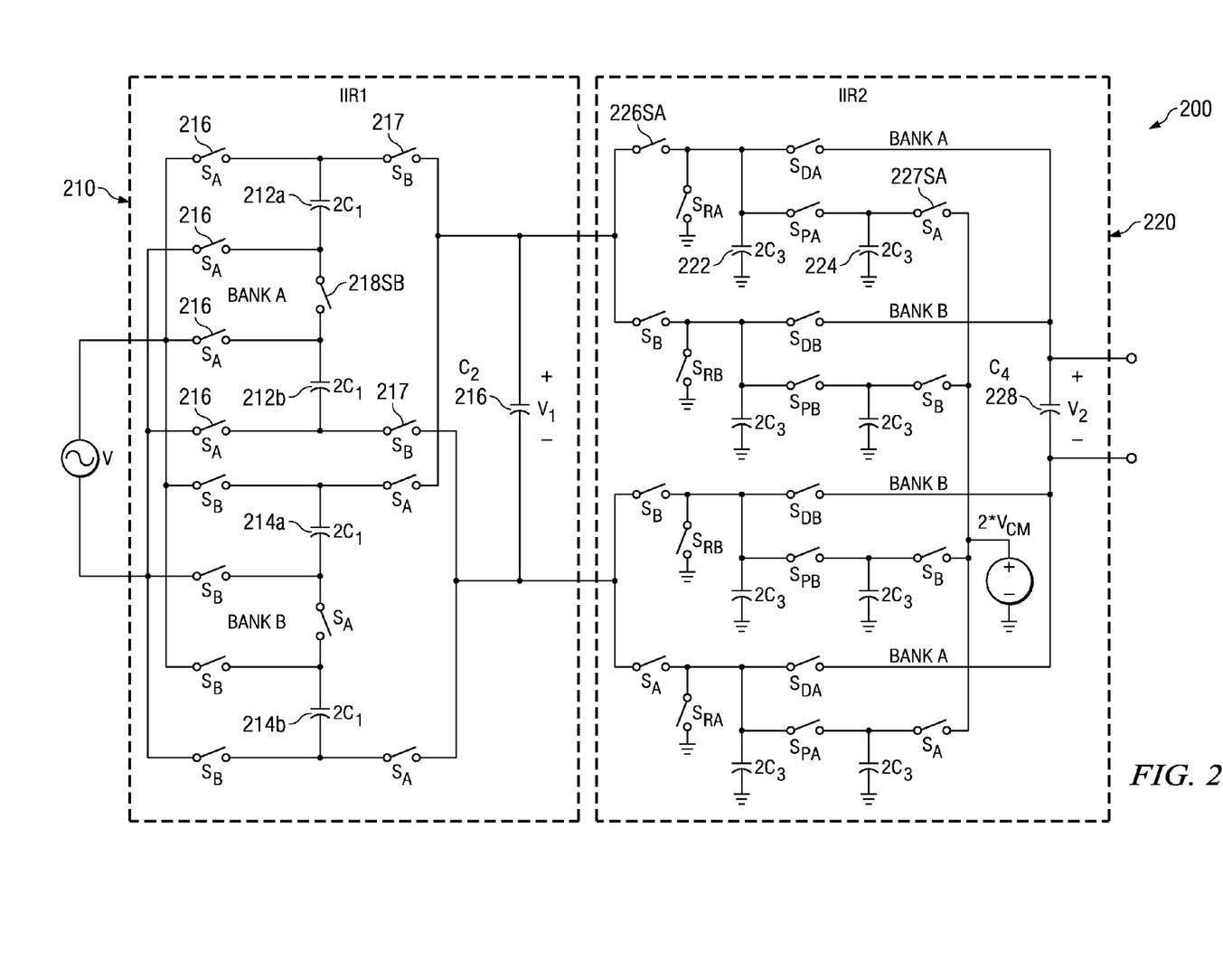
FIG. 2 is a schematic of one embodiment of a passive switched capacitor filter for use in the digital system of FIG. 1.

FIG. 2 is a schematic of one embodiment of a passive switched capacitor filter 200 for use in digital system 100. SCF 200 is a passive 2-pole switch capacitor filter implementation that provides an on-chip filter that has lower power and low noise requirement as compared to prior passive or active SCF filters. SCF 200 is a two pole filter, the first pole being implemented in IIR1 210 and the second pole in IIR2 220. IIR1 incorporates stacked capacitors 212a and 212b in a first bank A and 214a and 214b in a second bank B. In operation, these capacitors and switches perform as a virtual resistor, while capacitor 216 performs as the capacitor of a classic RC filter.

Figure 3:
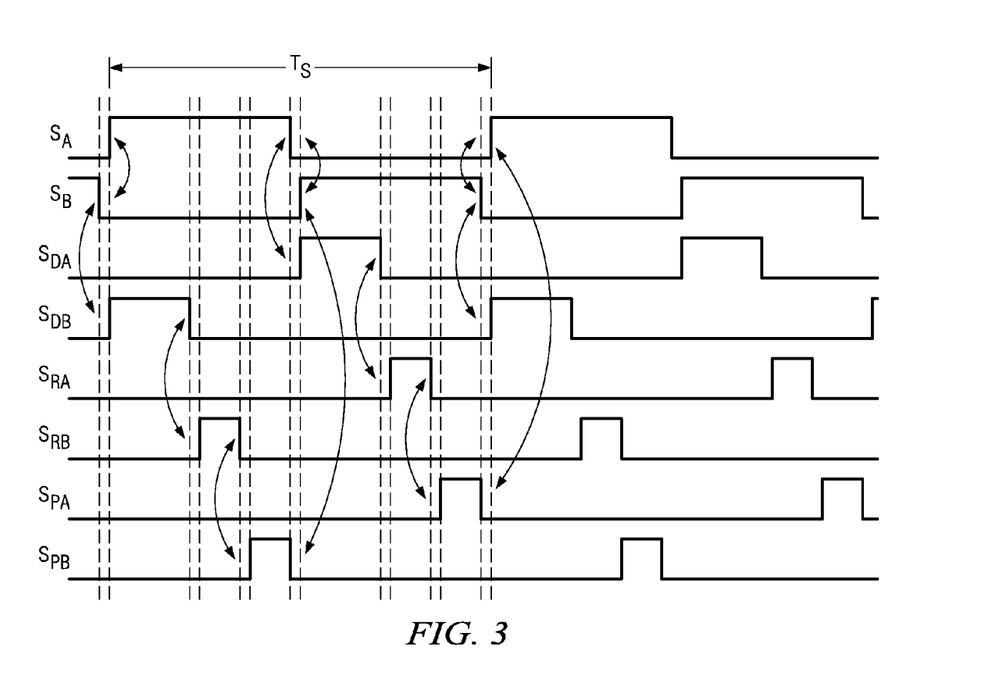
FIG. 3 is a timing diagram illustrating operation of control signals provided to the switched capacitor filter of FIG. 2.

FIG. 3 is a timing diagram illustrating operation of control signals provided to switched capacitor filter 200 from DCU 118. All of the control signals are non-overlapping so that one group of switches is turned off before the next group is turned on. The various arrows indicate signals that are critical for non-overlapped operation. Control signal $S_A$ controls MOSFET switches $S_A$, control signal $S_B$ controls MOSFET switches $S_B$, etc. MOSFET switches $216S_A$ are closed on the first half of a cycle while MOSFET switches $217S_B$-$218S_B$ are open. During the first half of the cycle voltage V output from mixer 112 (FIG. 1) is applied to both capacitor 212a and capacitor 212b in parallel. During the second half of the cycle, switches 216 $S_A$ are opened and switches $216S_B$-$218S_B$ are closed. Switch $218S_B$ connects capacitor 212a and capacitor 212b in series so that the voltage applied to filter capacitor 216 is doubled, thereby producing a gain within filter stage 210. Bank B operates in a similar manner on the opposite half cycles.

Filter stage 220 has two banks of switched capacitors, bank A and bank B, that each has two mirror image portions, a positive side and a negative side referenced to ground. Filter stage 220 samples the voltage across capacitor 216. The positive portion of bank A includes capacitor 222 that is connected to one output of filter stage 210 by switch 226 $S_A$ that is closed during the first half of the cycle. Simultaneously, precharge capacitor 224 is connected to reference voltage $2V_{CM}$ by switch $227S_A$. During the second half of the cycle, switches $226S_A$ and $227S_A$ are opened and charge on capacitor 222 is transferred to filter capacitor 228 via switch $S_{DA}$. After a period of time, switch $S_{DA}$ is opened and capacitor 222 is discharged to ground by reset switch $S_{RA}$ for a period of time. Then switch $S_{RA}$ is opened and capacitor 222 is connected to precharge capacitor 224 for a period of time via switch $S_{PA}$. The negative portion of bank A operates in a similar manner, while the positive and negative portions of Bank B operate in a similar manner on the opposite half cycles to produce a filtered output across filter capacitor 228. However, due to the reset of sampling capacitors of IIR2, gain is degraded and finite input impedance exists.

Figure 4:
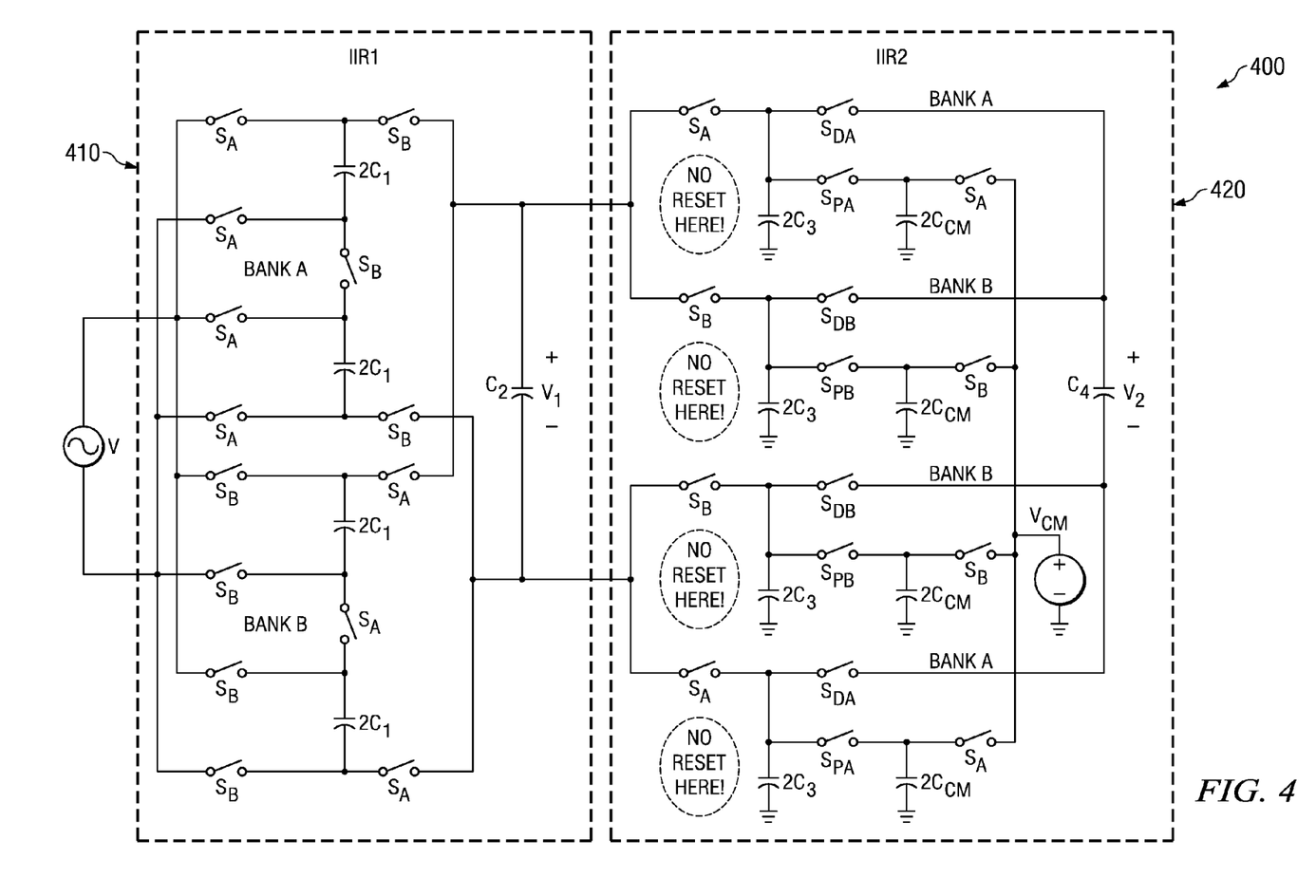
FIG. 4 is a schematic of another embodiment of a passive switched capacitor filter for use in the digital system of FIG. 1.

FIG. 4 is a schematic of another embodiment of a passive switched capacitor filter 400 for use in the digital system of FIG. 1. A different topology is utilized in FIG. 4 to improve the gain and the input impedance. This is mainly accomplished by implementing a different way of common mode generation. Compared to SCF 200 in FIG. 2, the sampling capacitor's reset signals $S_{RA}$ and $S_{RB}$ are gone, and the gain is improved since less charge is dumped to ground.

Figure 5:
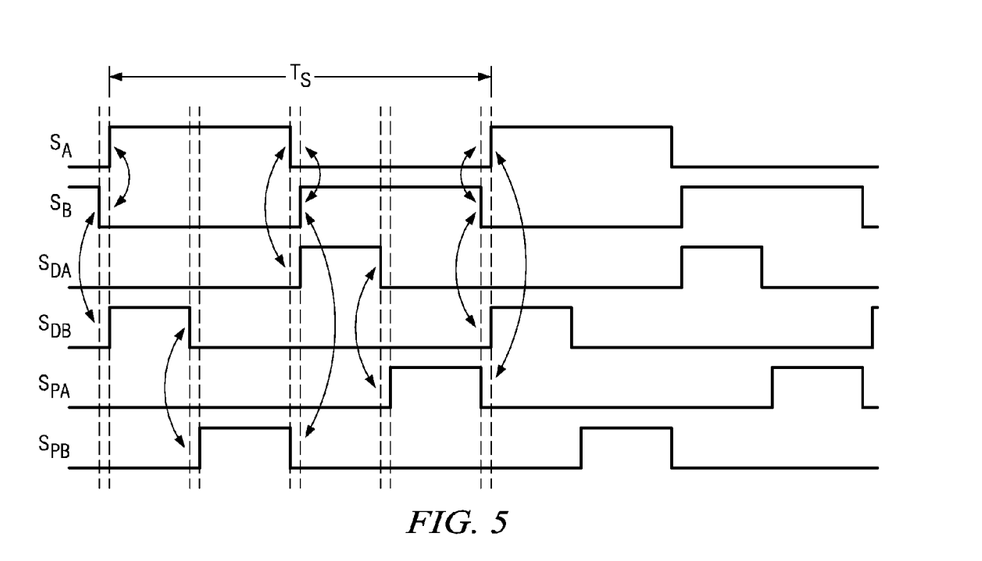
FIG. 5 is a timing diagram illustrating operation of control signals provided to the switched capacitor filter of FIG. 4.

FIG. 5 is a timing diagram illustrating operation of control signals provided to switched capacitor filter 400 from DCU 118 (FIG. 1). All of the control signals are non-overlapping so that one group of switches is turned off before the next group is turned on. The various arrows indicate signals that are critical for non-overlapped operation. Control signal $S_A$ controls MOSFET switches $S_A$, control signal $S_B$ controls MOSFET switches $S_B$, etc.

Let the discrete-time period be 0.5 TS. The z-domain equations for V1(z) and V2(z) are $$z \cdot V_1(z) = 2 \cdot \frac{C_1}{C_1 + C_2 + C_3} V(z) + \frac{C_2}{C_1 + C_2 + C_3} V_1(z) + \frac{C_3}{C_1 + C_2 + C_3} \frac{C_3}{C_3 + C_{CM}} V_2(z) \quad (1)$$

$$z \cdot V_2(z) = \frac{C_3}{C_3 + C_4} V_1(z) + \frac{C_4}{C_3 + C_4} V_2(z) \quad (2)$$

Solving (1) and (2), the z-domain transfer from V(z) to V1(z), V1(z) to V2(z), and V(z) to V2(z) could be derived.

$$\frac{V_1(z)}{V(z)} = \frac{2 \cdot \frac{C_1}{C_1 + C_2 + C_3} \cdot \left(z - \frac{C_4}{C_3 + C_4}\right)}{\left(z - \frac{C_2}{C_1 + C_2 + C_3}\right) \cdot \left(z - \frac{C_4}{C_3 + C_4}\right) - \frac{C_3^3}{(C_1 + C_2 + C_3)(C_3 + C_4)(C_3 + C_{CM})}} \quad (3)$$

$$\frac{V_2(z)}{V_1(z)} = \frac{\frac{C_3}{C_3 + C_4}}{z - \frac{C_4}{C_3 + C_4}} \quad (4)$$

$$\frac{V_2(z)}{V(z)} = \frac{2 \cdot \frac{C_1 C_3}{(C_1 + C_2 + C_3)(C_3 + C_4)}}{\left(z - \frac{C_2}{C_1 + C_2 + C_3}\right) \cdot \left(z - \frac{C_4}{C_3 + C_4}\right) - \frac{C_3^3}{(C_1 + C_2 + C_3)(C_3 + C_4)(C_3 + C_{CM})}} \quad (5)$$

The DC gain now becomes $$Gain_{SCF} = \frac{2C_1}{C_1 + \left(\frac{C_3 C_{CM}}{C_3 + C_{CM}}\right)} = \frac{2C_1}{C_1 + (C_3 \text{ in series with } C_{CM})} \quad (6)$$

The equivalent input impedance is also calculated as $$R_{in} = \frac{1}{\left(C_1 \text{ in series with } \frac{C_3 C_{CM}}{C_3 + C_{CM}}\right) \cdot 8 f_S} \quad (7)$$

TABLE 1

Summary of characteristics for SCF 200 and SCF 400

| Characteristic | SCF 200 | SCF 400 |
|---|---|---|
| $Gain_{SCF}$ | $\frac{2C1}{C1 + C3}$ | $\frac{2C1}{C1 + \frac{C3 C cm}{C3 + C cm}}$ |
| $R_{in}$ | $\frac{1}{\frac{C1 C3}{C1 + C3} * 8 fs}$ | $\frac{1}{\left[C1 \text{ in series with } \frac{C1 C3}{C1 + C3}\right] * 8 fs}$ |
| $f_{3DB,IIR1}$ | $\frac{1}{2\pi} * \frac{C1 + C3}{C1 + C2 + C3} * 2fs$ | (3) by Matlab |
| $f_{3DB,IIR2}$ | $\frac{1}{2\pi} * \frac{C3}{C3 + C4} * 2fs$ | $\frac{1}{2\pi} * \frac{C3}{C3 + C4} * 2fs$ |
| $f_{3DB,SCF}$ | | (5) by Matlab |

Table 1 summarizes the characteristics of SCF 200 and SCF 400. It could be easily shown that SCF 400 has higher gain and input impedance than SCF 200. This is because $$\frac{C_3 C_{CM}}{C_3 + C_{CM}} < C_3 \quad (8)$$

For example, in SCF 400, assume the following values: C1=0.54 pF, C2=136.192 pF, C3=0.157 pF, C4=29.824 pF, CCM=0.15 pF, and fS=225 MHz. Using the equations from Table 1, DC gain=4.8669 dB, Input impedance $R_{in}$=8.271 KΩ, $f_{3\ dB,\ IIR2}$=375.047 KHz.

Figure 6:
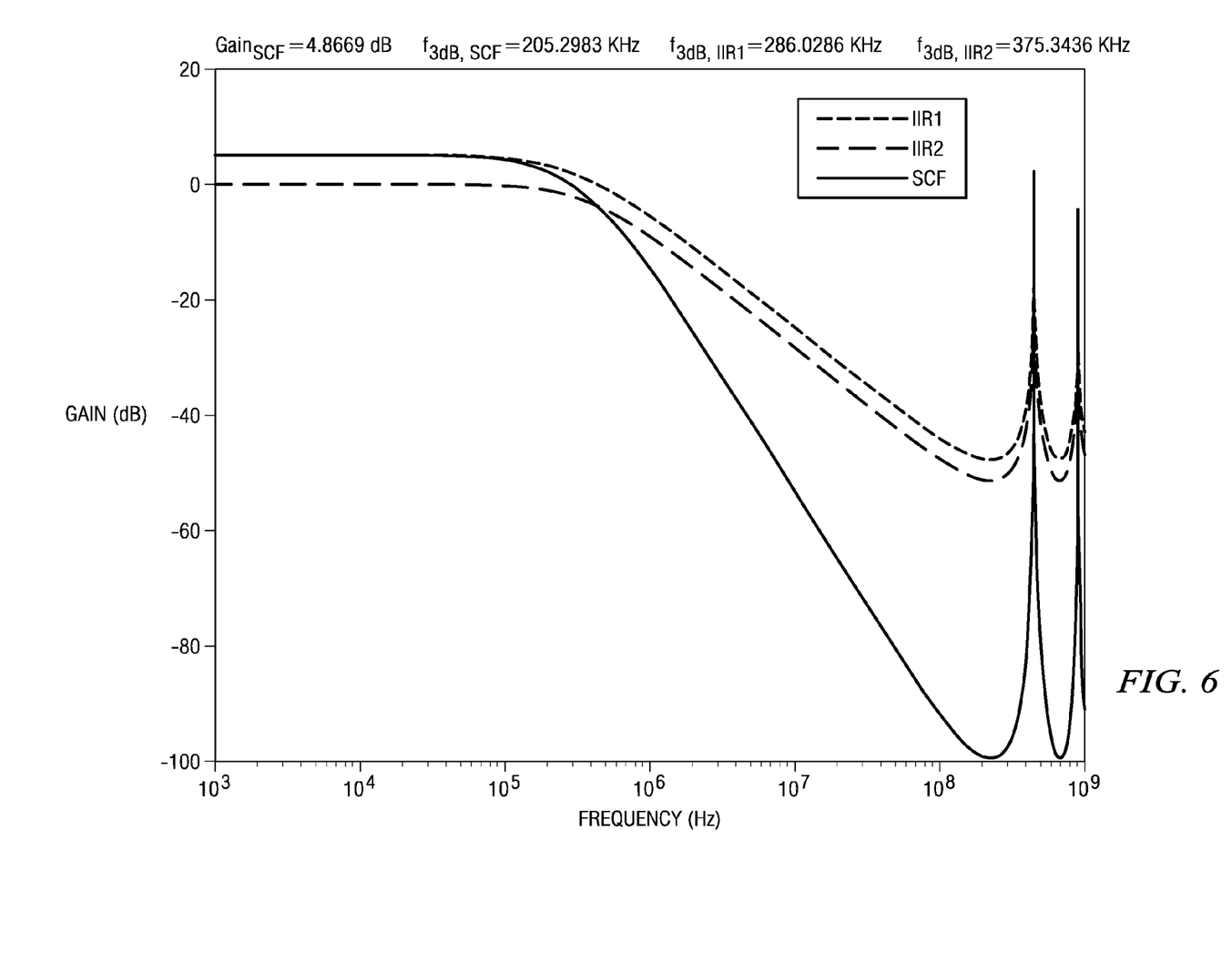
FIG. 6 is a frequency response plot for a particular configuration of the filter of FIG. 4.

FIG. 6 shows the results calculated using Matlab, a known circuit simulation tool. The −3 dB pole frequency of the SCF $f_{3\ dB,\ SCF}$=205.3 KHz, and the −3 dB pole frequency of IIR1 $f_{3\ dB,\ IIR1}$=286 KHz. The single pole response of each of IIR1 and IIR2 is illustrated and the combined two pole response of SCF 400 is also illustrated.

Figure 7:
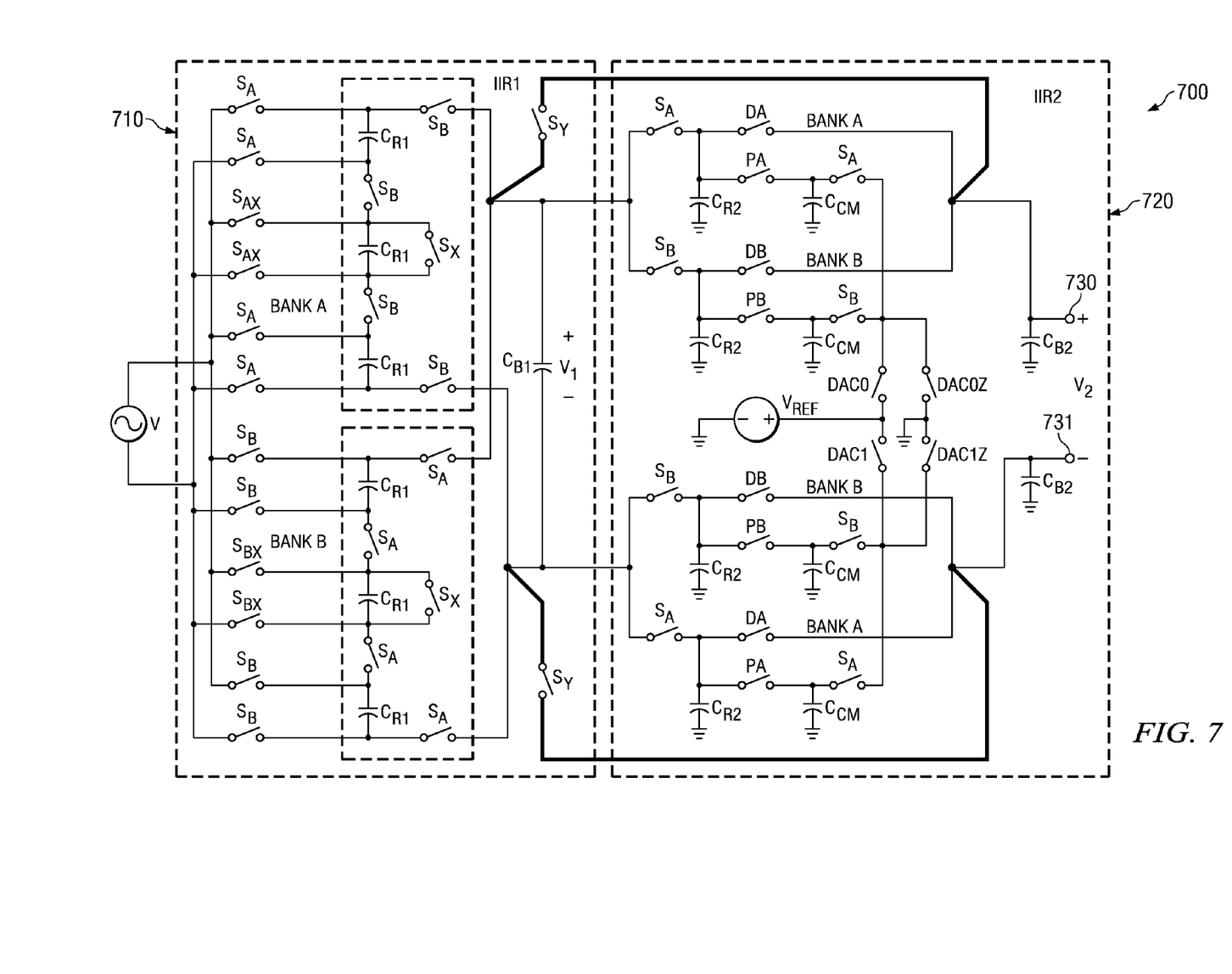
FIG. 7 is a schematic of another embodiment of a passive switched capacitor filter for use in the digital system of FIG. 1.

FIG. 7 is a schematic of another embodiment of a passive switched capacitor filter 700 for use in digital system 100. SCF 700 is a two pole filter, the first pole being implemented in IIR1 710 and the second pole in IIR2 720. IIR1 710 incorporates three stacked capacitors $C_{R1}$ in a first bank A and three capacitors $C_{R1}$ in a second bank B. In operation, these capacitors and related switches SA, SAX, $S_B$ and SBX perform as a virtual resistor, while capacitor $C_{B1}$ performs as the capacitor of a classic RC filter, similar to the operation of SCF 200 and SCF 400. In this embodiment, configuration switches SX allow one capacitor $C_{R1}$ to be bypassed in each of bank A and bank B so that either a two capacitor stack or a three capacitor stack can be dynamically selected during operation to thereby change the gain of SCF 700. When switches SX are closed to bypass the one capacitor $C_{R1}$ switches SAX and SAB are disabled so that the corresponding capacitor $C_{R1}$ is not charged.

When IIR1 710 is operated with two stacked capacitors in each bank, the gain of SCF 700 is similar to that of SCF 400 at around 4 dB. When IIR1 is operated with three stacked capacitors, the gain of SCF 700 is approximately 7 dB.

SCF 700 also includes two bypass switches SY that allow the output of IIR1 to be either connected to the input of IIR2 for further filter processing or to be connected directly to outputs 730-731 and thereby bypass filter section IIR2 720. In this manner, the bandwidth response can be dynamically selected during operation of digital system. For example, this dynamic bandwidth selection allows good operation for both GGE and WCDMA cellular phone applications.

Multi-tap operation is provided by allowing control circuitry, not shown, to change the configuration of the capacitor stack and filter coefficients dynamically under program control of a system that is using SCF 700.

SCF 700 also includes a reset switches DAC0 and DAC1 that cause sampling capacitors $C_{R2}$ to be reset at the end of each sample period. Switches DAC0Z and DAC1Z are controlled in such a way that they operate in an inverted manner from DAC0 and DAC1, respectively. By changing the duty cycle of DAC0 and DAC1, the SCF output common mode can be set to desired values. This set of switches has multiple purposes. It is basically a 1-bit DAC, indicated as DAC 123 in FIG. 1, where the digital signals (DAC1, DAC1Z, DAC0, DAC0Z) are converted into an analog signal that takes a value in the range between the Vref signal and ground. This analog signal is coupled to the common mode capacitors $C_{CM}$ via switches SA and SB. These digital signals are generated from a sigma-delta modulator in FCU 116 (referring to FIG. 1) which provides very high resolution even though DAC 123 is just a single-bit DAC. The functions provided by DAC 123 are as follows: 1) control common mode to SCF output 730-731; and 2) Cancel out any DC offset at SCF output 730-731 and at the output of ABE 130.

FCU 116 monitors the DC offset at the output of ADC 134. FCU 116 then sets the duty cycle of DAC0 and DAC1 and injects a negative DC offset into DAC0 and DAC1 which defines the common mode and cancels the DC offset at SCF 700 output.

SCF 700 also contains control circuitry, not shown, that allows switches SA, SB and SX in IIR1 710 to be disabled under program control while switches $S_A$ and $S_B$ continue to operate in IIR2 720 to allow gain calibration of ABE 130.

Figure 8:
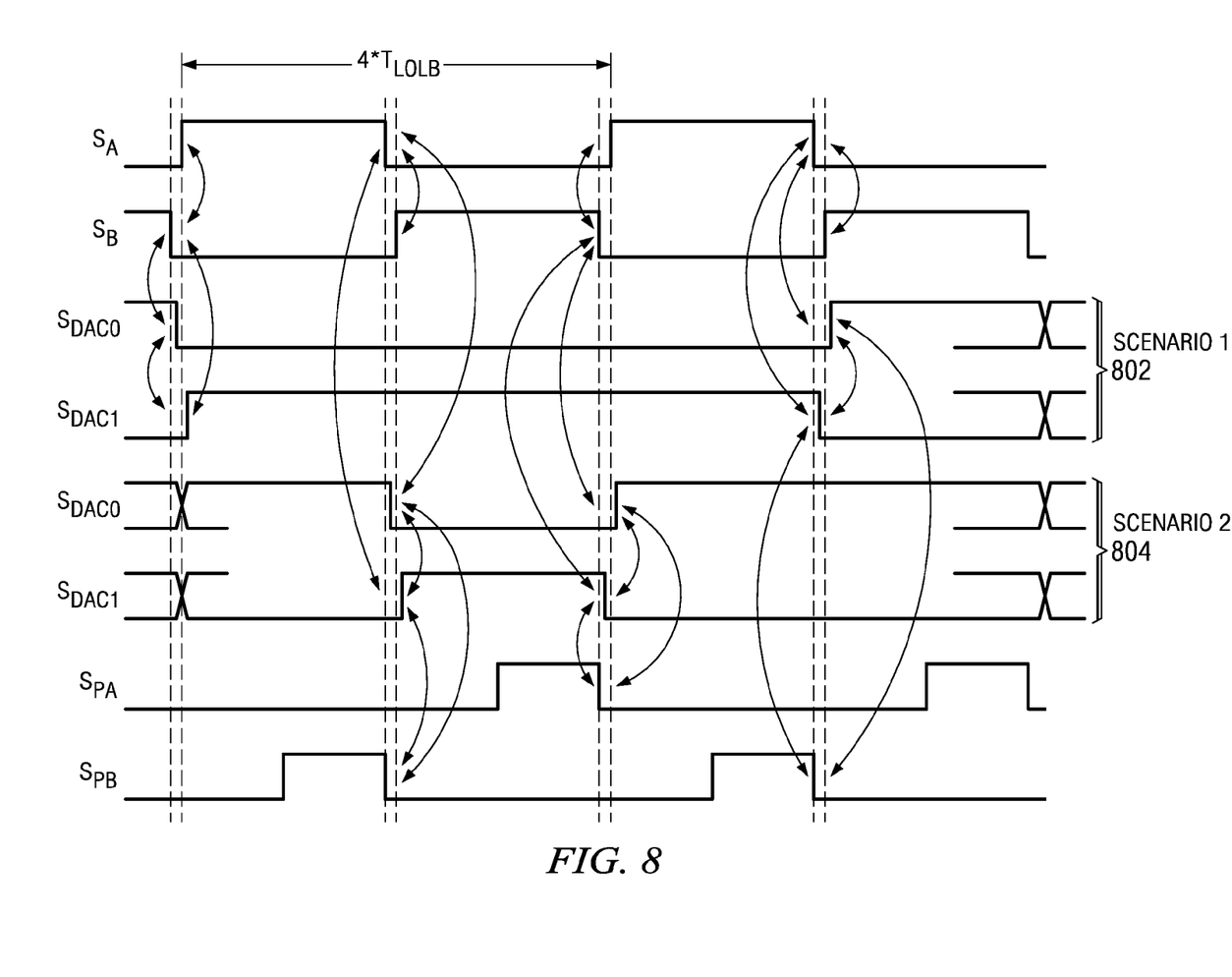
FIG. 8 is a timing diagram illustrating operation of control signals provided to the switched capacitor filter of FIG. 7.

FIG. 8 is a timing diagram illustrating operation of control signals provided to the switched capacitor filter of FIG. 7. All of the control signals are non-overlapping so that one group of switches is turned off before the next group is turned on. The various arrows indicate signals that are critical for non-overlapped operation. Timing for signals $S_A$, $S_B$, $S_{DA}$, $S_{DB}$, $S_{PA}$ and $S_{PB}$ is the same as that shown in FIG. 6. Control signal $S_A$ controls MOSFET switches $S_A$, control signal $S_B$ controls MOSFET switches $S_B$, etc. Scenario 1 802 and scenario 2 804 illustrate two possible timing relationships with $S_A$ and $S_B$.

As mentioned earlier, switches DAC0, DAC1, DAC0Z and DAC1Z form one bit DAC 123. Control signals $S_{DAC0}$ and $S_{DAC1}$ are modulated by a sigma-delta modulator in FCU 116 to have various duty cycles and to cancel DC offset Other sequences are generated as needed by FCU provide common mode control, as discussed above.

Figure 9:
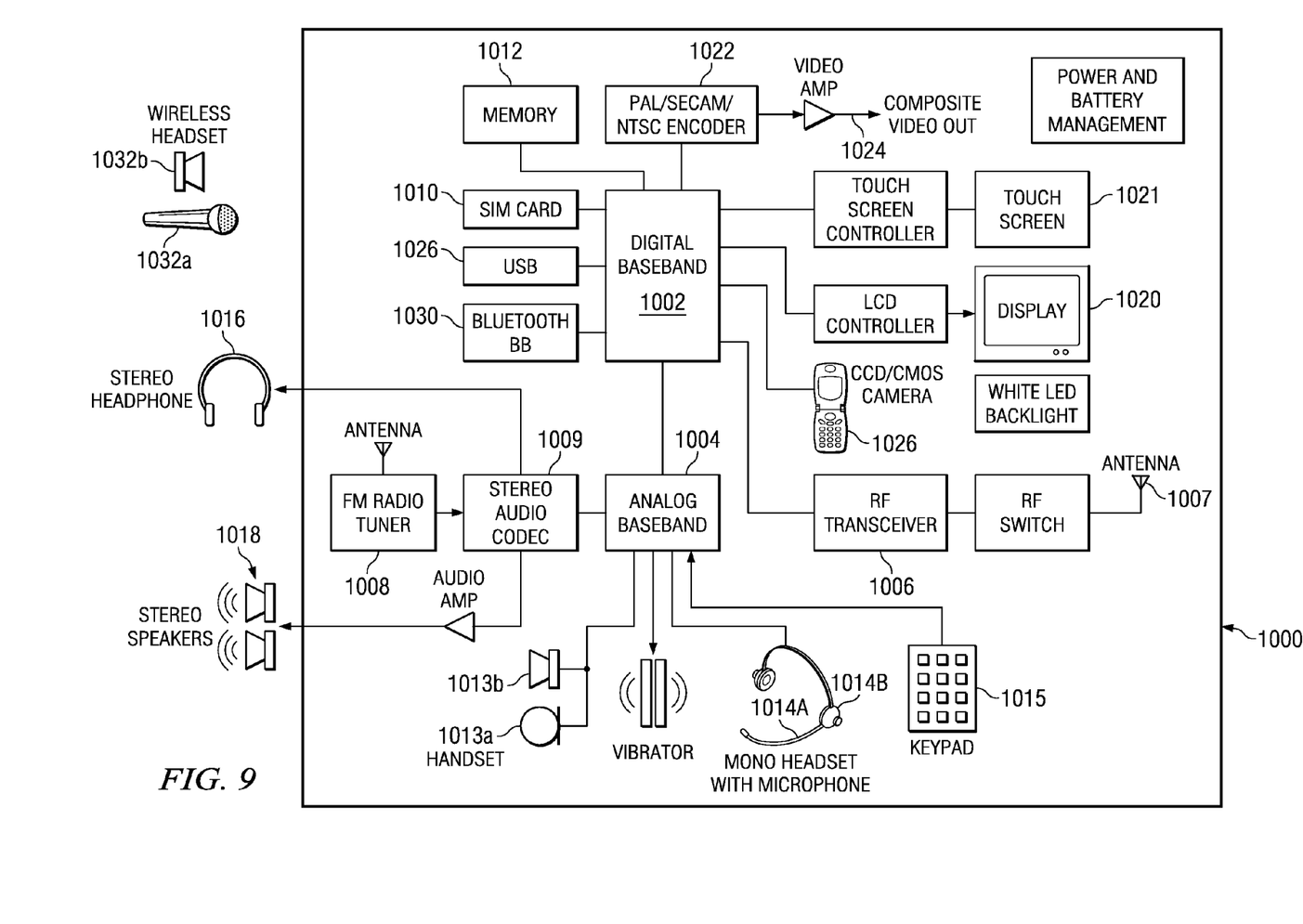
FIG. 9 is a block diagram of another digital system with an embodiment of a passive switched capacitor filter.

FIG. 9 is a block diagram of another digital system 1000 with an embodiment of a passive switched capacitor filter. Digital system 1000 a representative cell phone 1000 that includes an embodiment of the present invention for analog front end filtering using a passive configurable switched capacitor filter. Digital baseband (DBB) unit 1002 is a digital processing processor system that includes embedded memory and security features. In this embodiment, DBB 1002 is an open media access platform (OMAP™) available from Texas Instruments designed for multimedia applications. Some of the processors in the OMAP family contain a dual-core architecture consisting of both a general-purpose host ARM™ (advanced RISC (reduced instruction set processor) machine) processor and one or more DSP (digital signal processor). The digital signal processor featured is commonly one or another variant of the Texas Instruments TMS320 series of DSPs. The ARM architecture is a 32-bit RISC processor architecture that is widely used in a number of embedded designs.

Although the invention finds particular application to Digital Signal Processors (DSPs), implemented, for example, in an Application Specific Integrated Circuit (ASIC), it also finds application to other forms of processors. An ASIC may contain one or more megacells which each include custom designed functional circuits combined with pre-designed functional circuits provided by a design library.

Analog baseband (ABB) unit 1004 performs processing on audio data received from stereo audio codec (coder/decoder) 1009. Audio codec 1009 receives an audio stream from FM Radio tuner 1008 and sends an audio stream to stereo headset 1016 and/or stereo speakers 1018. In other embodiments, there may be other sources of an audio stream, such a compact disc (CD) player, a solid state memory module, etc. ABB 1004 receives a voice data stream from handset microphone 1013a and sends a voice data stream to handset mono speaker 1013b. ABB 1004 also receives a voice data stream from microphone 1014a and sends a voice data stream to mono headset 1014b. Usually, ABB and DBB are separate ICs. In most embodiments, ABB does not embed a programmable processor core, but performs processing based on configuration of audio paths, filters, gains, etc being setup by software running on the DBB. In an alternate embodiment, ABB processing is performed on the same OMAP processor that performs DBB processing. In another embodiment, a separate DSP or other type of processor performs ABB processing.

RF transceiver 1006 includes a receiver for receiving a stream of coded data frames from a cellular base station via antenna 1007 and a transmitter for transmitting a stream of coded data frames to the cellular base station via antenna 1007. The transceiver includes an analog front end that incorporates a configurable passive switched capacitor (SCF) filter as described above. A control program executing on DBB 1002 can dynamically configure the capacitances and/or filter coefficients of the switched capacitor filter by setting various control bits in the control circuitry of the SCF as described above in order to adjust the operating characteristics of cell phone 1000 as needed. In this embodiment, a single transceiver supports both GSM and WCDMA operation by dynamically changing the filter characteristics of the SCM in the analog front end. Other embodiments may have transceivers for a later developed transmission standard with appropriate configuration of the SCF. RF transceiver 1006 is connected to DBB 1002 which provides processing of the frames of encoded data being received and transmitted by cell phone 1000. RF transceiver 1006 contains an analog front end having a passive switched capacitor filter as described above.

The basic WCDMA DSP radio consists of control and data channels, rake energy correlations, path selection, rake decoding, and radio feedback. Interference estimation and path selection is performed by instructions stored in memory 1012 and executed by DBB 1002 in response to signals received by transceiver 1006.

DBB unit 1002 may send or receive data to various devices connected to USB (universal serial bus) port 1026. DBB 1002 is connected to SIM (subscriber identity module) card 1010 and stores and retrieves information used for making calls via the cellular system. DBB 1002 is also connected to memory 1012 that augments the onboard memory and is used for various processing needs. DBB 1002 is connected to Bluetooth baseband unit 1030 for wireless connection to a microphone 1032*a* and headset 1032*b* for sending and receiving voice data.

DBB 1002 is also connected to display 1020 and sends information to it for interaction with a user of cell phone 1000 during a call process. Display 1020 may also display pictures received from the cellular network, from a local camera 1026, or from other sources such as USB 1026.

DBB 1002 may also send a video stream to display 1020 that is received from various sources such as the cellular network via RF transceiver 1006 or camera 1026. DBB 1002 may also send a video stream to an external video display unit via encoder 1022 over composite output terminal 1024. Encoder 1022 provides encoding according to PAL/SECAM/NTSC video standards.

As used herein, the terms "applied," "connected," and "connection" mean electrically connected, including where additional elements may be in the electrical connection path. "Associated" means a controlling relationship, such as a memory resource that is controlled by an associated port. The terms assert, assertion, de-assert, de-assertion, negate and negation are used to avoid confusion when dealing with a mixture of active high and active low signals. Assert and assertion are used to indicate that a signal is rendered active, or logically true. De-assert, de-assertion, negate, and negation are used to indicate that a signal is rendered inactive, or logically false.

While the invention has been described with reference to illustrative embodiments, this description is not intended to be construed in a limiting sense. Various other embodiments of the invention will be apparent to persons skilled in the art upon reference to this description. For example, in another embodiment, a passive, configurable SCF with more than two poles or more than two stacked capacitors may be implemented.

It is therefore contemplated that the appended claims will cover any such modifications of the embodiments as fall within the true scope and spirit of the invention.

What is claimed is:

1. A digital system, comprising:
   a front end amplifier connected to receive a signal being operable to amplify the signal;
   a passive switched capacitor filter connected to receive the amplified signal and having an output for providing a filtered signal, the switched capacitor filter having at least two sections each operable as a pole, wherein a first section of the at least two sections comprise sets of at least two stacked sampling capacitors interconnected with a set of switches operable to further amplify the amplified signal provided to an input of the first section in response to operation of the set of switches; and
   a back end section connected to the output of the switched capacitor filter to receive the filtered signal.

2. The digital system of claim 1, wherein the switched capacitor filter includes pole control switches connected to allow the switched capacitor filter to be dynamically configured during operation to operate selectively as either a one pole filter or as a two pole filter.

3. The digital system of claim 2, wherein the first section comprises three or more sets of stacked sampling capacitors connected to stack control switches operable to dynamically configure the passive switched capacitor filter to operate with either two sets of stacked sampling capacitors or with three or more sets of stacked sampling capacitors.

4. The digital system of claim 2 being a cellular telephone handset, further comprising:
   an output of a radio receiver connected to the front end amplifier;
   a digital processing system connected to an output of the backend section; and
   wherein the backend section comprises an analog to digital converter connected to receive the filtered signal and operable to provide a digital version of the filtered signal to the digital processing system.

5. The digital system of claim 4, further comprising a processor controllably coupled to the switched capacitor filter, the processor also coupled to a memory, the memory storing instructions executable by the processor for dynamically configuring the switched capacitor filter.

6. A digital system, comprising:
   a passive switched capacitor filter connected to receive a signal and having an output for providing a filtered signal, the switched capacitor filter having at least two sections each operable as a pole, wherein a first section of the at least two sections comprise sets of at least two stacked sampling capacitors interconnected with a set of switches operable to amplify the received signal provided to an input of the first section in response to operation of the set of switches; and
   a backend section connected to the output of the switched capacitor filter to receive the filtered signal.

7. The digital system of claim 6, wherein a second section of the at least two sections further comprises:
   stage two sampling capacitors switchably connected to an output of the first section operable to alternately sample a signal on the output of the first section;
   common mode capacitors each switchably connected to a respective stage two sampling capacitor;
   a digital to analog converter coupled to the reference voltage signal, operable to generate an analog voltage signal, the analog voltage signal switchably coupled to the common mode capacitors; and
   a feedback control unit coupled to an output of the backend section to receive a representative filtered signal and connected to provide a digital signal to the digital to analog converter, operable to cancel a DC offset at the output of the switched capacitor filter.

8. The digital system of claim 7, wherein the feedback control unit is operable to cancel a DC offset from the output of the backend unit.

9. The digital system of claim 7, wherein the switched capacitor filter includes pole control switches connected to allow the switched capacitor filter to be dynamically configured during operation to operate selectively as either a one pole filter or as a two pole filter.

10. The digital system of claim 9, wherein the first section comprises three or more sets of stacked sampling capacitors connected to stack control switches operable to dynamically configure the passive switched capacitor filter to operate with either two sets of stacked sampling capacitors or with three or more sets of stacked sampling capacitors.

11. A method of performing passive switched capacitor filtering, comprising:
   receiving an input signal;
   simultaneously sampling the input signal on two or more sampling capacitors during a periodic first phase to form a sampled voltage on each sampling capacitor;
   stacking the two or more sampling capacitors in series during a periodic second phase to create an amplified sampled voltage while transferring the amplified sampled voltage to a filter capacitor to form a first filter pole, wherein the second phase is out of phase from the first phase; and outputting a first stage filtered signal from the filter capacitor.

12. The method of claim 11, further comprising:

simultaneously sampling the input signal on two or more alternate sampling capacitors during the periodic second phase to form a second sampled voltage on each alternate sampling capacitor; and connecting the two or more alternate sampling capacitors in series during the periodic first phase to create an amplified second sampled voltage while transferring the amplified second sampled voltage to the filter capacitor.

13. The method of claim 12, further comprising:

providing the first stage filtered signal to a second pole filter;

sampling the first stage filtered signal during the periodic first phase to form a second stage sample voltage while transferring the second stage sample voltage to a second stage filter capacitor for a portion of the periodic first phase;

charging a common mode capacitor to a reference voltage value during the periodic first phase;

precharging the second stage sampling capacitor by connecting the common mode capacitor to the second stage sampling capacitor during a second portion of the periodic first phase; and outputting a second stage filtered signal from the second stage filter capacitor.

14. The method of claim 13, further comprising dynamically adjusting the reference voltage to cancel a common mode voltage from the second stage filtered signal.

15. The method of claim 13, further comprising dynamically bypassing the stage two sampling capacitor by connecting the first stage filtered output directly to the second stage filter capacitor.

16. The method of claim 11, further comprising dynamically configuring the stacking so that either only two sample capacitors are connected in series or else three or more sample capacitors are connected in series, whereby the bandwidth of the passive switched filter can by dynamically configured.

* * * * *